United States Patent
Kapla et al.

(10) Patent No.: US 11,949,032 B2
(45) Date of Patent: Apr. 2, 2024

(54) SYSTEMS AND METHODS FOR IMPROVED INSTALLATION OF PHOTOVOLTAIC ASSEMBLIES

(71) Applicant: SUNPOWER CORPORATION, San Jose, CA (US)

(72) Inventors: John Paul Kapla, Mill Valley, CA (US); Kyle Donald Feldmann, Richmond, CA (US)

(73) Assignee: SunPower Corporation, San Jose, CA (US)

( * ) Notice: Subject to any disclaimer, the term of this patent is extended or adjusted under 35 U.S.C. 154(b) by 581 days.

(21) Appl. No.: 15/242,275

(22) Filed: Aug. 19, 2016

(65) Prior Publication Data

US 2018/0054157 A1    Feb. 22, 2018

(51) Int. Cl.
*H01L 31/042*    (2014.01)
*H01L 31/048*    (2014.01)
*H02S 30/00*    (2014.01)

(52) U.S. Cl.
CPC .......... *H01L 31/048* (2013.01); *H02S 30/00* (2013.01); *Y02E 10/50* (2013.01)

(58) Field of Classification Search
CPC ........ H01L 31/048; H02S 30/00; Y02E 10/50
See application file for complete search history.

(56) References Cited

U.S. PATENT DOCUMENTS

| | | | |
|---|---|---|---|
| 5,143,556 A | * | 9/1992 | Matlin .................. F24J 2/5232 136/244 |
| 7,435,134 B2 | | 10/2008 | Lenox |
| 7,780,472 B2 | | 8/2010 | Lenox |
| 8,424,255 B2 | | 4/2013 | Lenox et al. |
| 8,763,316 B2 | | 7/2014 | Concho et al. |
| 9,416,992 B2 | | 8/2016 | Braunstein et al. |
| 2007/0274774 A1 | * | 11/2007 | Jacquet ................. F16B 5/0692 403/338 |
| 2011/0108089 A1 | * | 5/2011 | du Boise ............... F24S 30/425 136/246 |

(Continued)

FOREIGN PATENT DOCUMENTS

FR    2840964    * 12/2003

OTHER PUBLICATIONS

English machine translation of FR 2840964, pp. 1-5 (Year: 2003).*

*Primary Examiner* — Thanh Truc Trinh
(74) *Attorney, Agent, or Firm* — Schwabe, Williamson & Wyatt, P.C.

(57) ABSTRACT

Improved photovoltaic (PV) assemblies for converting solar radiation to electrical energy and methods of installation thereof are disclosed herein. PV arrays comprising a plurality PV modules are also described herein. A PV assembly can comprise at least one PV module having a front side and a back side opposite the front side. A PV module can comprise a plurality of solar cells encapsulated within a PV laminate. In some embodiments, a PV module includes a frame at least partially surrounding the PV laminate. In such embodiments, frame can comprise an outer surface feature. The PV assembly can further comprise at least one spacing device positioned between adjacent PV modules. A spacing device can comprise a spacer body having a predetermined width for defining a predetermined distance or gap between adjacent PV modules.

12 Claims, 9 Drawing Sheets

(56) References Cited

U.S. PATENT DOCUMENTS

| | | | |
|---|---|---|---|
| 2012/0097207 A1* | 4/2012 | Shufflebotham | B32B 38/1841 |
| | | | 136/244 |
| 2013/0011187 A1* | 1/2013 | Schuit | F16B 2/065 |
| | | | 403/287 |
| 2013/0340810 A1* | 12/2013 | Danning | H02S 20/23 |
| | | | 136/251 |
| 2014/0311054 A1 | 10/2014 | Concho et al. | |

* cited by examiner

1

SYSTEMS AND METHODS FOR IMPROVED INSTALLATION OF PHOTOVOLTAIC ASSEMBLIES

BACKGROUND

Solar power has long been viewed as an important alternative energy source. To this end, substantial efforts and investments have been made to develop and improve upon solar energy collection technology. Of particular interest are residential-, industrial- and commercial-type applications in which relatively significant amounts of solar energy can be collected and utilized in supplementing or satisfying power needs. One way of implementing solar energy collection technology is by assembling an array of multiple solar modules.

One type of solar energy system is a solar photovoltaic system. Solar photovoltaic systems ("photovoltaic systems") can employ solar panels made of silicon or other materials (e.g., III-V cells such as GaAs) to convert sunlight into electricity. Photovoltaic systems typically include a plurality of photovoltaic (PV) modules (or "solar tiles") interconnected with wiring to one or more appropriate electrical components (e.g., switches, inverters, junction boxes, etc.)

A typical conventional PV module includes a PV laminate or panel having an assembly of crystalline or amorphous semiconductor devices ("PV cells" or "solar cells") electrically interconnected and encapsulated within a weatherproof barrier. One or more electrical conductors are housed inside the PV laminate through which the solar-generated current is conducted.

Regardless of an exact construction of the PV laminate, most PV applications entail placing an array of solar modules at the installation site in a location where sunlight is readily present. This is especially true for residential, commercial or industrial applications in which multiple solar modules are desirable for generating substantial amounts of energy, with the rooftop of the structure providing a convenient surface at which the solar modules can be placed.

In some arrangements, solar modules are placed side-by-side in an array. Each solar module can be mounted to a support structure, such as a roof, by coupling the module to a mounting structure (e.g., a rail) by way of a coupling member (e.g., a clamp, clip, anchor or mount). It can be challenging to couple modules side-by-side because the array assembler typically engages the coupling member while also ensuring that adjacent modules are positioned properly on the mounting structure. Accordingly, there remains a continuing need for improved systems and methods for mounting solar modules to a support structure with minimal installation time and/or resources.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are not drawn to scale.

DETAILED DESCRIPTION

Figure 1:
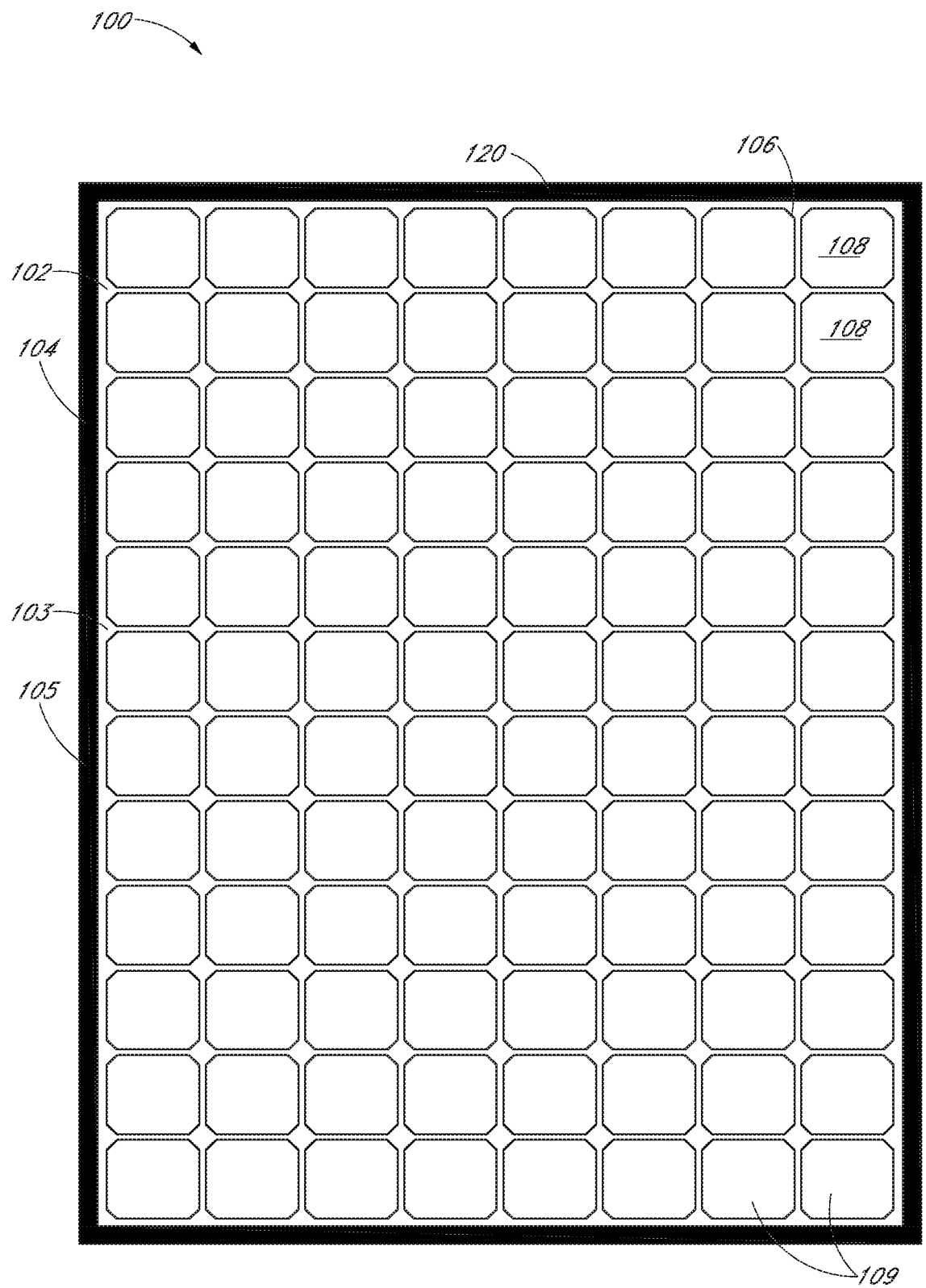
FIG. 1 depicts a front side of a photovoltaic (PV) module, in accordance with an embodiment of the present disclosure.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", "side", "axial", and "lateral" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Terminology—The following paragraphs provide definitions and/or context for terms found in this disclosure (including the appended claims):

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

This term "comprising" is open-ended. As used in the appended claims, this term does not foreclose additional structure or steps.

Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

As used herein, the terms "first," "second," etc. are used as labels for nouns that they precede, and do not imply any type of ordering (e.g., spatial, temporal, logical, etc.). For example, reference to a "first" encapsulant layer does not necessarily imply that this encapsulant layer is the first encapsulant layer in a sequence; instead the term "first" is used to differentiate this encapsulant from another encapsulant (e.g., a "second" encapsulant).

The terms "a" and "an" are defined as one or more unless this disclosure explicitly requires otherwise.

The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

As used herein, "inhibit" is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present invention. The feature or features of one embodiment can be applied to other embodiments, even though not described or illustrated, unless expressly prohibited by this disclosure or the nature of the embodiments.

Various embodiments disclosed herein relate to mounting an array of solar modules to a support structure, such as a roof. For example, a mounting structure, such as a rail, can be attached to the roof or other support structure by way of one or more roof anchors. Solar modules can be positioned atop the rails adjacent to one another and can be coupled to the rails by way of a coupling member, such as a clamp assembly. When installing solar modules to form a PV array, an assembler may encounter various challenges. For example, the assembler may attempt to bring two adjacent rows of solar modules into alignment, while simultaneously clamping one or more solar modules to the rails. In many circumstances, it can be challenging to align adjacent rows of an array, for example if the rows do not share a common rail. Accordingly, various embodiments disclosed herein are configured to assist an assembler in constructing an array.

For example, in some embodiments, a spacing device is provided to aid in alignment of rows and or columns of a photovoltaic (PV) array to enable minimal installation times and resources.

Improved PV assemblies for converting solar radiation to electrical energy and methods of installation thereof are disclosed herein. PV arrays comprising a plurality PV modules are also described herein. A PV assembly can comprise at least one PV module having a front side and a back side opposite the front side. A PV module can comprise a plurality of solar cells encapsulated within a PV laminate. In some embodiments, a PV module includes a frame at least partially surrounding the PV laminate. In such embodiments, frame can comprise an outer surface feature. The PV assembly can further comprise at least one spacing device positioned between adjacent PV modules. A spacing device can comprise a spacer body having a predetermined width for defining a predetermined distance or gap between adjacent PV modules. As one example, adjacent modules or rows may share a common mounting structure or rail. In various embodiments, the spacing device can comprise at least one engagement feature for engaging at least one PV module. The spacing device can also comprise an abutting feature or portion for resting against or contacting at least one PV module.

FIG. 1 illustrates a top-down view of a module 100 having a front side 102 that faces the sun to collect solar radiation during normal operation and a back side 104 opposite the front side 102. The module 100 comprises a laminate 106 encapsulating a plurality of solar cells 108. In some embodiments, the module 100 can be 'frameless.' However, in other embodiments, module 100 comprises a support member or frame 120 surrounding the laminate 106, such as depicted in FIG. 1. The frame 120 can be formed of a metal (e.g. aluminum) material, a polymeric material, or a combination thereof. In other embodiments, a support member or frame can partially surround the laminate. In some embodiments, the frame 120 can be integrally formed or formed as a unitary body. In other embodiments, the frame 120 can be formed from an assembly of parts.

The solar cells 108 can face the front side 102 and be arranged into a plurality of solar cell strings 109. The laminate 106 can include one or more encapsulating layers which surround and enclose the solar cells 108. In various embodiments, the laminate 106 comprises a top cover 103 made of glass or another transparent material on the front side 102. In certain embodiments, the material chosen for construction of the cover 103 can be selected for properties which minimize reflection, thereby permitting the maximum amount of sunlight to reach the solar cells 108. The top cover 103 can provide structural rigidity to the laminate 106. The laminate 106 can further comprise a backsheet 105 on the back side 104. The backsheet 105 can be a weatherproof and electrically insulating layer which protects the underside of the laminate 106. The backsheet 105 can be a polymer sheet, and it can be laminated to encapsulant layer(s) of the laminate 106, or it can be integral with one of the layers of the encapsulant.

Figure 2:
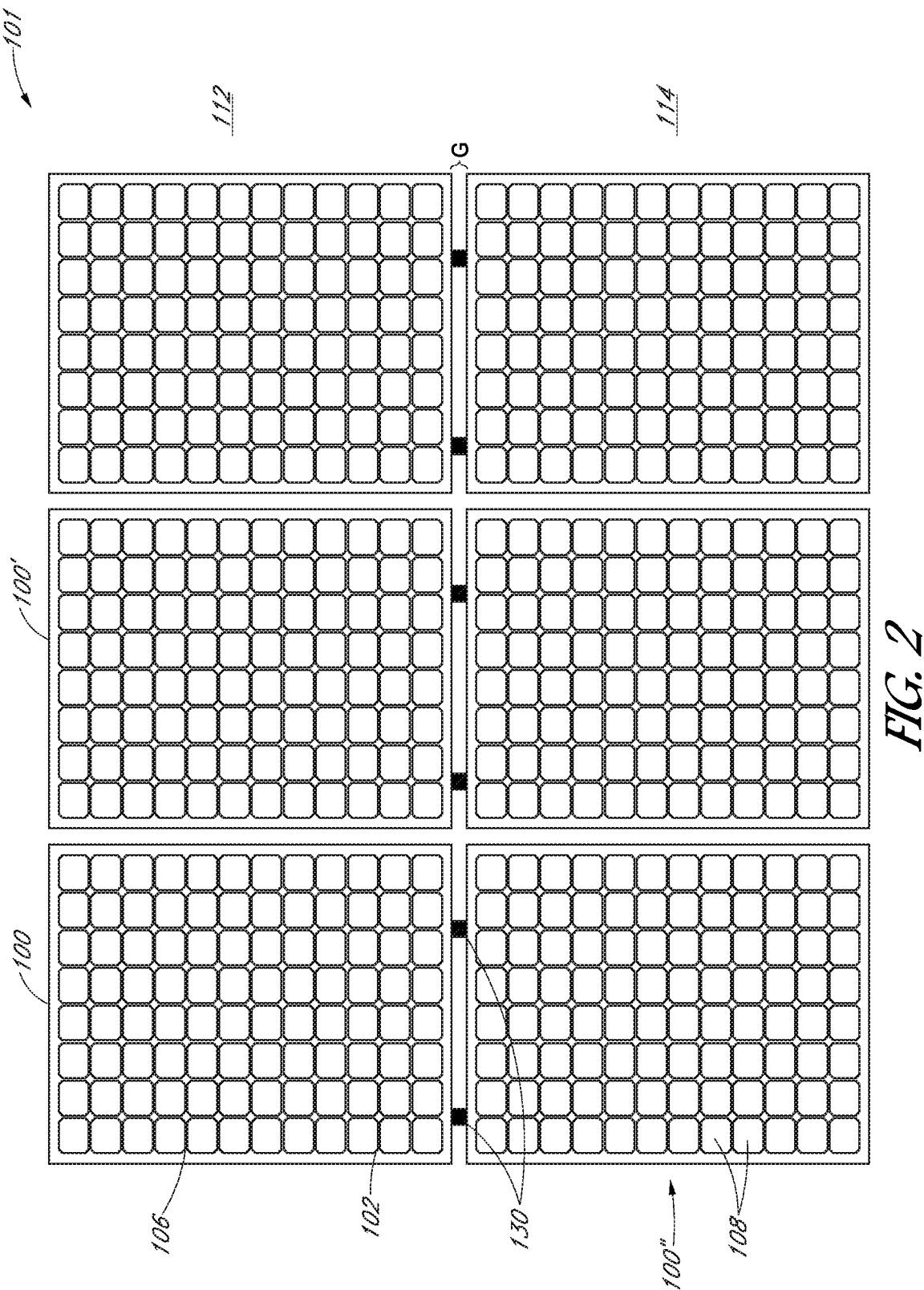
FIG. 2 depicts a front side of a PV assembly, in accordance with an embodiment of the present disclosure.

FIG. 2 illustrates a top-down view of a photovoltaic assembly 101 comprising a plurality of modules 100 (individual modules depicted as 100, 100', 100") arranged into a photovoltaic array 101. Each module 100 has a front side 102 that faces the sun during normal operation and a laminate 106 comprising a plurality of solar cells 108. The photovoltaic array 101 can be configured in a "portrait" orientation as depicted in FIG. 2. However in other embodiments, modules can be arranged in a "landscape" orientation. Six PV modules 100 are depicted in the example of FIG. 2, however any desirable number of modules can be provided in any desirable configuration to form a PV array.

The PV assembly of FIG. 2 comprises a plurality of PV modules 100 arranged into a plurality of rows of PV array 101. For ease of description, three PV modules 100 are arranged into a first row 112 and three PV modules 100 are arranged into a second row 114. In one embodiment, the first and second rows 112/114 are adjacent such as depicted in FIG. 2. The first row 112 and the second row 114 are separated by a predetermined distance or gap G. The PV assembly of FIG. 2 comprises a plurality of spacing devices 130 positioned between PV modules of adjacent rows 112/114 of PV array 101. The plurality of spacing devices 130 are located in or set the gap G between adjacent rows 112/114. In the exemplary embodiment depicted in FIG. 2, two spacing devices 130 are provided between adjacent modules in adjacent rows (e.g. two spacing devices between module 100 of row 112 and module 100" of row 114). However, any desirable number of spacing device can be provided in any desirable arrangement. For example, one spacing device can be provided between adjacent modules. In various embodiments, one or more spacing devices can be provided between adjacent rows of a PV array, adjacent columns of a PV array, or a combination thereof.

Figure 3:
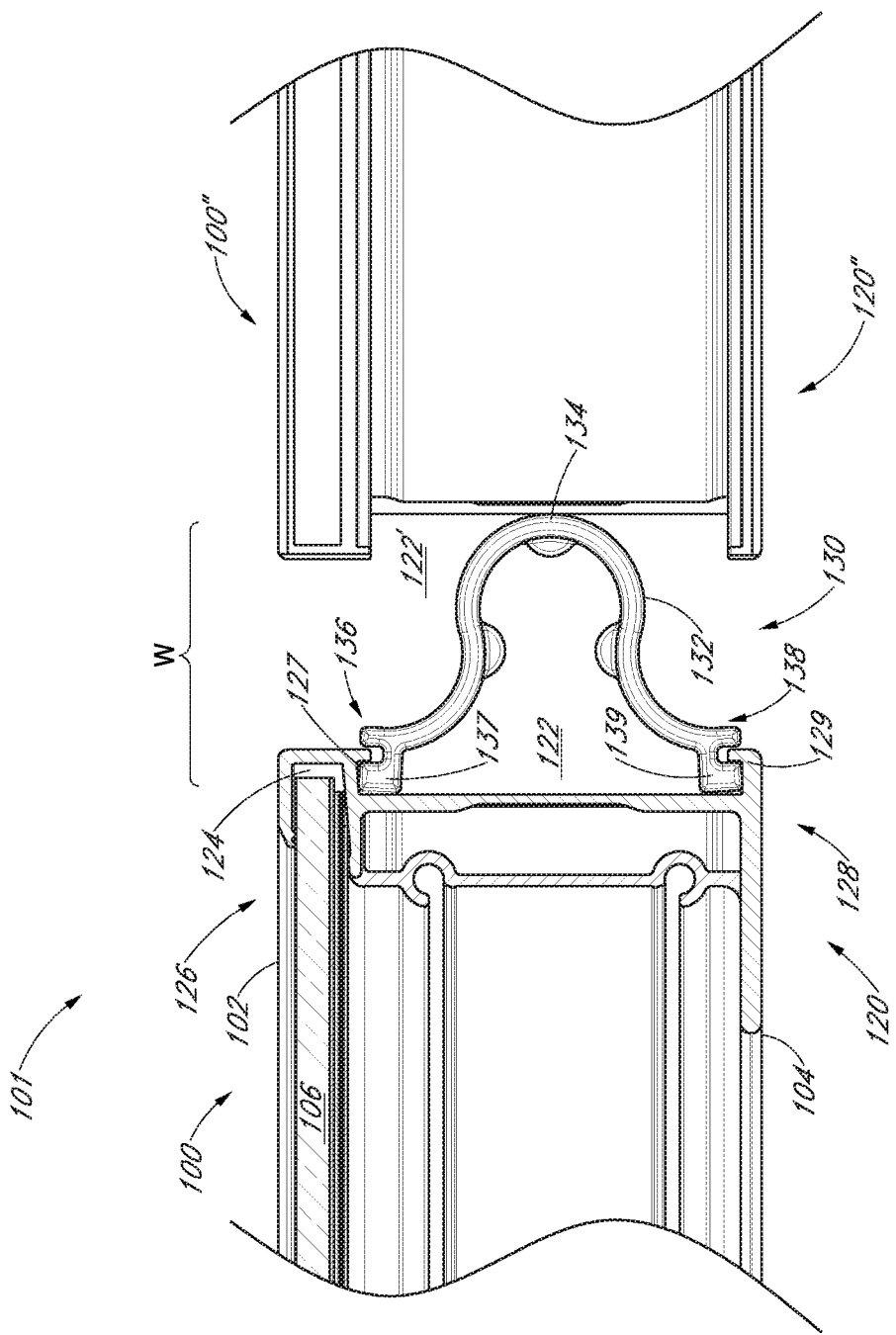
FIG. 3 depicts a side view of PV assembly, in accordance with an embodiment of the present disclosure.

FIG. 3 depicts a side view of PV assembly 101 comprising module 100 of row 112, module 100" of row 114 and spacing device 130 therebetween. The cross sectional view of module 100 in FIG. 3 shows frame 120 surrounding the laminate 106 to define an outer edge 122 of PV module 100. The frame 120 comprises an upper portion 126 comprising a laminate-receiving channel 124. The upper portion 126 of frame 120 further comprises an upper surface feature, flange or lip 127 at outer edge 122. Furthermore, the frame 120 comprises a lower base portion 128 comprising a lower surface feature, flange or lip 129 at outer edge 122 of PV module 100. In the embodiment depicted in FIG. 3, the upper and lower surface features 127/129 of frame 120 comprise longitudinally extending ridges, however any desirable surface feature on the frame can be provided. For example, the frame can comprise flanges, lips, ridges, recesses, projections, sinusoidal cross sections, saw-tooth cross sections, substantially planar surfaces, combinations thereof, or derivatives thereof.

In an embodiment, the spacing device 130 comprises a spacer body 132 having a predetermined width W so as to set or define a predetermined distance or gap G between adjacent PV modules 100/100". In some embodiments, spacing devices can comprise at least one engagement feature for engaging one or more outer surface features of a PV module so as to fixedly connect the spacing device to the PV module. For example, spacing device 130 comprises an upper arm 136 comprising an upper engagement feature 137 for engaging the upper surface feature 127 of frame 120. The spacing device 130 further comprises a lower arm 138 comprising a lower engagement feature 139 for engaging the lower surface feature 129 of frame 120. In some embodiments, the PV module can be frameless and a spacing device can comprise one or more engagement features for engaging any desirable feature of the PV module (e.g. the laminate 106).

In an embodiment, body 132 of spacing device 130 can comprise a compressible feature such that upon contact or engagement of the spacing device 130 with the module 100, the spacing device is fixedly connected to the module. In one embodiment, the compressible feature can be integrally formed with the spacing device such that the spacing device is molded as a single component. In other embodiments, the compressible feature can be formed separately from the spacing device and then subsequently coupled to the spacing device. Non-limiting examples of the compressible feature include a compressible polymer material, a metallic wire, a spring tensioned structure, a sinusoidal shaped structure, a W-shaped structure, a U-shaped structure, an S-shaped structure, an X-shaped structure, a spiral structure, a coil, a spring, or a combination thereof.

In an embodiment, a spacing device can comprise one or more abutting portions for contacting an outer edge of a PV module so as to set or maintain a gap between modules during installation. As depicted in FIG. 3, spacing device 130 comprises an abutting portion 134 for contacting outer edge 122' of PV module 100'. In the non-limiting example of FIG. 3, spacing device 130 comprises two engagement features 137/139 for engaging a first module 100 in a first row 112 of array 101 and one abutting portion 134 for contacting in a second module 100' in a second row 114 of array 101. In various embodiments, a spacing device can comprise one or more engagement features for engaging one or more PV modules of an array. Furthermore, in some embodiments, a spacing device can comprise one or more abutting features for contacting or butting against one or more PV modules of an array.

Figure 4:
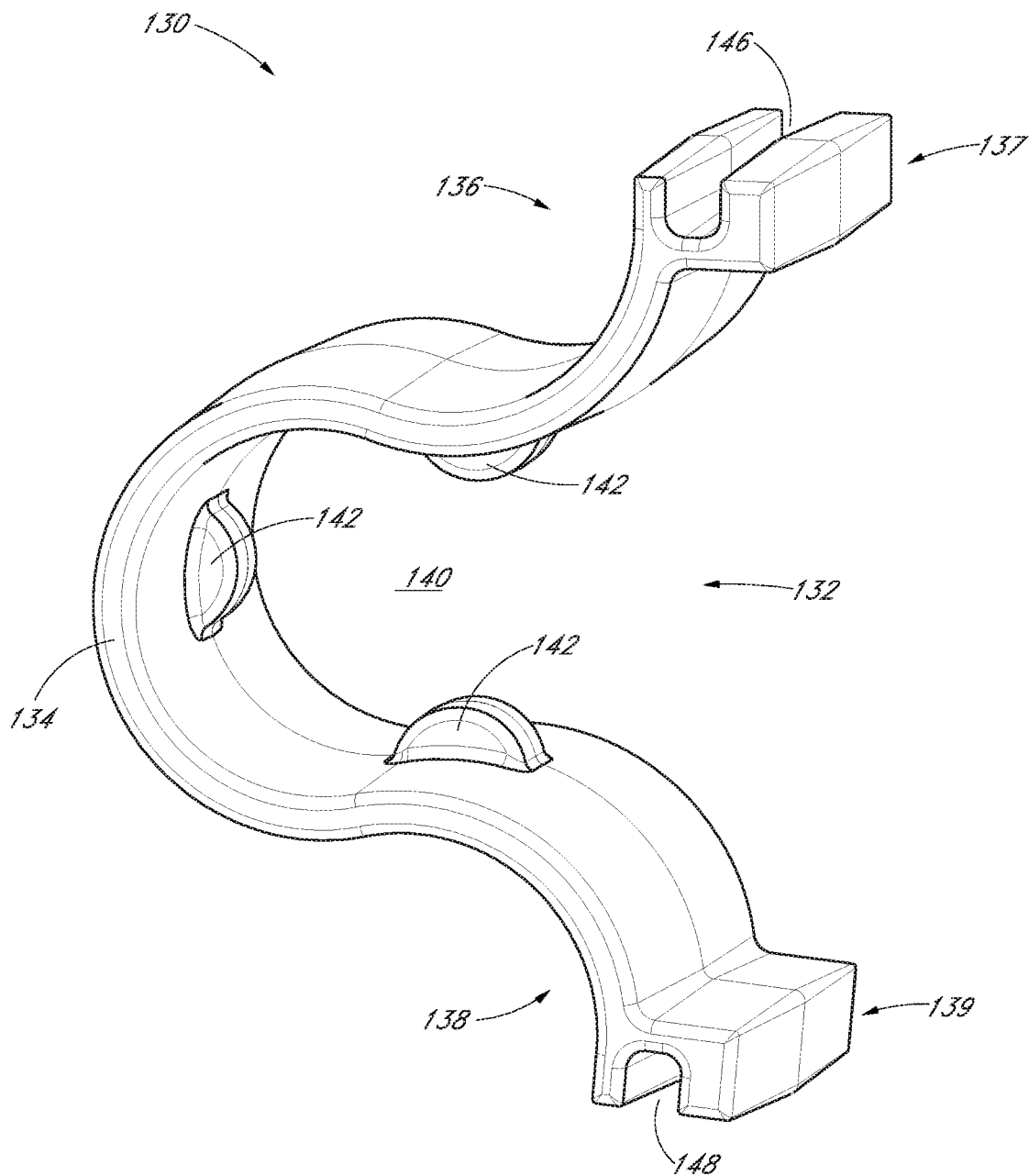
FIG. 4 depicts a magnified view of a spacing device, in accordance with an embodiment of the present disclosure.

FIG. 4 depicts a magnified view of spacing device 130. The spacing device 130 comprises an upper arm 136, a lower arm 138 and a body 132 therebetween. As shown, the upper and lower engagement features 137/139 of the upper and lower arms 136/138 comprise recesses 146/148 sized to fit upper and lower surface features 127/129 of frame 120.

In an embodiment, the body 132 of the spacing device is bent or curved such as depicted in FIG. 4. In other embodiments, the body of the spacing device can be substantially linear. The shape or structure of the body of the spacing device can be provided in any desirable structure or form. For example, the body of the spacing device can comprise a structure selected from the group of an incurvate structure, a serpentine structure, a bowed structure, a W-shaped structure, a U-shaped structure, an S-shaped structure, an X-shaped structure, a spiral structure, a coil, a spring, or a combination thereof.

In an embodiment, the spacing device comprises a polymeric material. For example, spacing devices can comprise materials selected from the group of: polyethylene (PE), polypropylene (PP), polystyrene (PS), polyphenylene oxide (PPO), polyvinyl chloride (PVC), polyetherether ketone (PEEK), polyamides, polycarbonates, acetal resins, acrylonitrile butadiene styrene (ABS) resins, their derivatives or combinations thereof. In one embodiment, a spacing device comprises a thermosetting polymer. In some embodiments, a spacing device comprises a thermoplastic material. Extrusion and/or injection molding manufacturing processes can be employed for production of the spacing device.

In one embodiment, spacing device comprises metallic elements and/or other flexible materials. For example, a spacing device can comprise a metal wire or stamped metal piece. In another embodiment, a spacing device can comprise a composite material. In yet another embodiment, the spacing device can comprise a metallic wire embedded within a polymeric and/or thermoplastic material.

In various embodiments, the body of the spacing device 130 forms a cavity 140 such as depicted in FIG. 4. In one embodiment, the spacing device can comprise one or more features within or extending into the cavity, for example to provide structural support to the spacing device or for wire or cable management. As depicted in FIG. 4, the spacing device 130 comprises a plurality of protrusions 142 extending into the cavity 140 which can facilitate management of cables or wires associated with the PV assembly 101. However in other embodiments, the body 132 of the spacing device 130 can be substantially smooth or planar throughout.

FIG. 1-4 illustrate various embodiments of PV assemblies and spacing devices. Unless otherwise specified below, the numerical indicators used to refer to components in the FIG. 5-8 are similar to those used to refer to components or features in FIG. 1-4 above, except that the index has been incremented by 100.

The body of the spacing device can comprise any desirable structure to set, establish or maintain a predetermined distance or gap between adjacent modules of a PV array during installation. In an embodiment, the body of the spacing device comprises a structure selected from the group of a linear structure, an incurvate structure, a serpentine structure, a bowed structure, a W-shaped structure, a U-shaped structure, an S-shaped structure, an X-shaped structure, a spiral structure, a coil, a spring, or any derivative or combination thereof.

Figure 5:
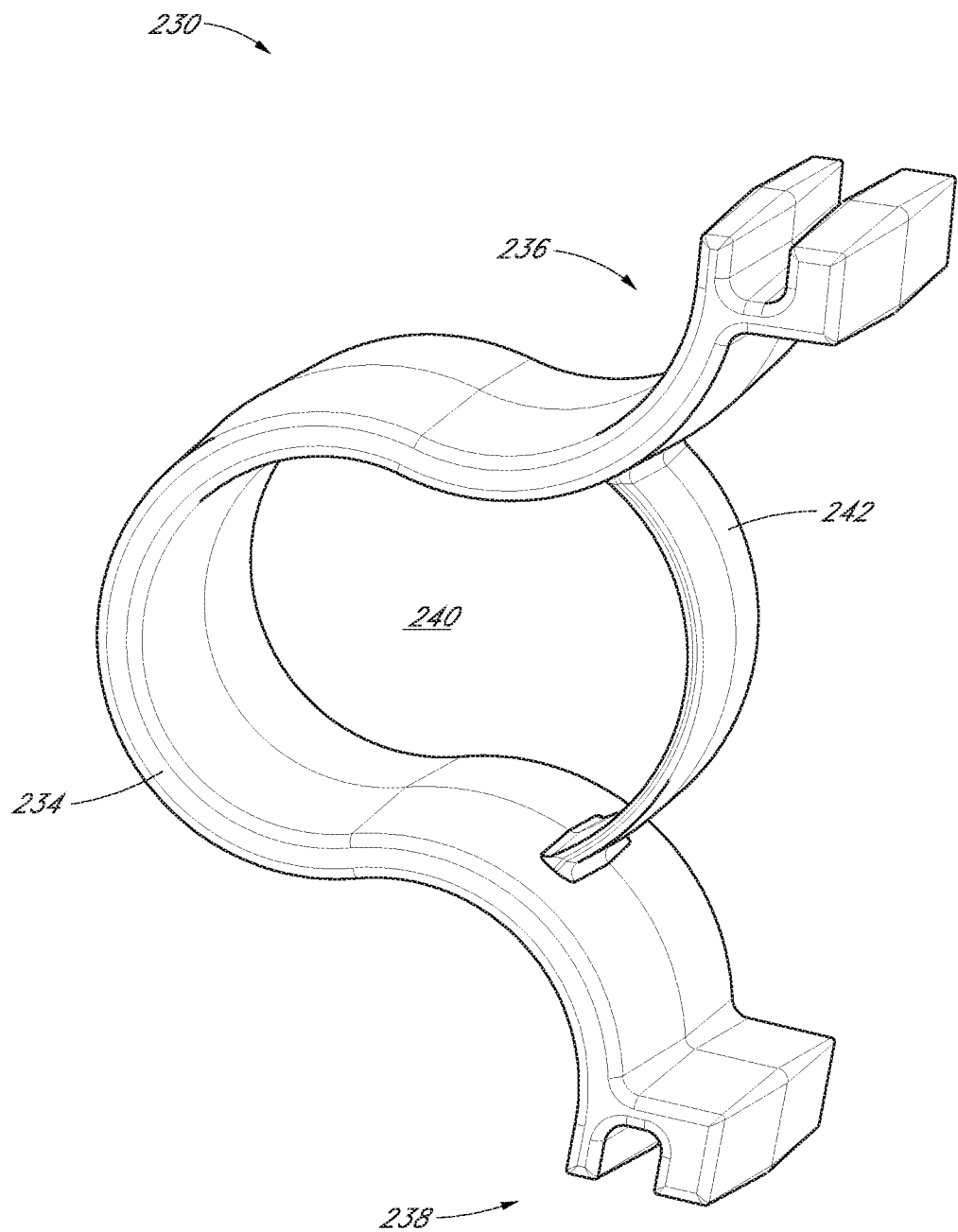
FIG. 5 depicts a magnified view of a spacing device, in accordance with an embodiment of the present disclosure.

In various embodiments, spacing devices comprise one or more features to provide structural support, to facilitate flexibility and/or to direct wires or cables associated with the array. In one embodiment, a spacing device comprises a crosspiece extending across a void or cavity of the spacing device. As an example, FIG. 5 depicts a spacing device 230 curved to form a cavity 240. The spacing device 230 further comprises a crosspiece 242 extending across cavity 240. A crosspiece can provide structural support to the spacing device, restrict flexibility of the spacing device and/or direct wires or cables associated with the array.

Figure 6:
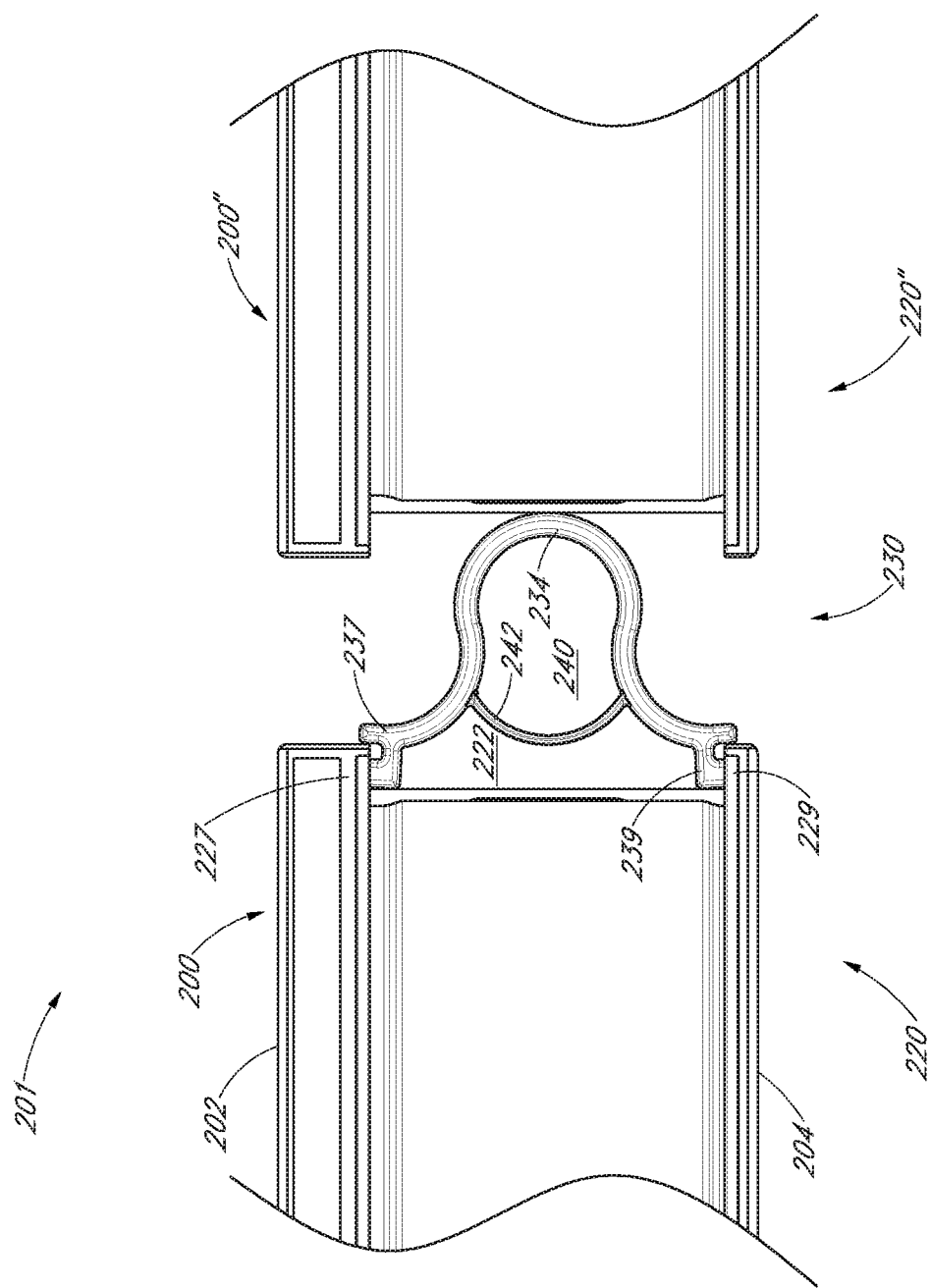
FIG. 6 depicts a side view of a PV assembly, in accordance with an embodiment of the present disclosure.

FIG. 6 depicts a side view of PV assembly 201 comprising a first module 200 of a first row, a second module 200" of a second row and spacing device 230 therebetween. In an embodiment, the first row of PV array 201 is adjacent to the second row of PV array 201. As depicted in FIG. 6, the spacing device 230 comprises upper and lower engagement features 237/239 for engaging with upper and lower surface features 227/229 of frame 220 of module 200. In other embodiments not depicted, a spacing device can further comprise one or more engagement features for engaging with at least one surface feature of frame 220" of module 200" in addition to one or more engagement features for engaging with at least one surface feature of frame 220 of module 200.

Figure 7:
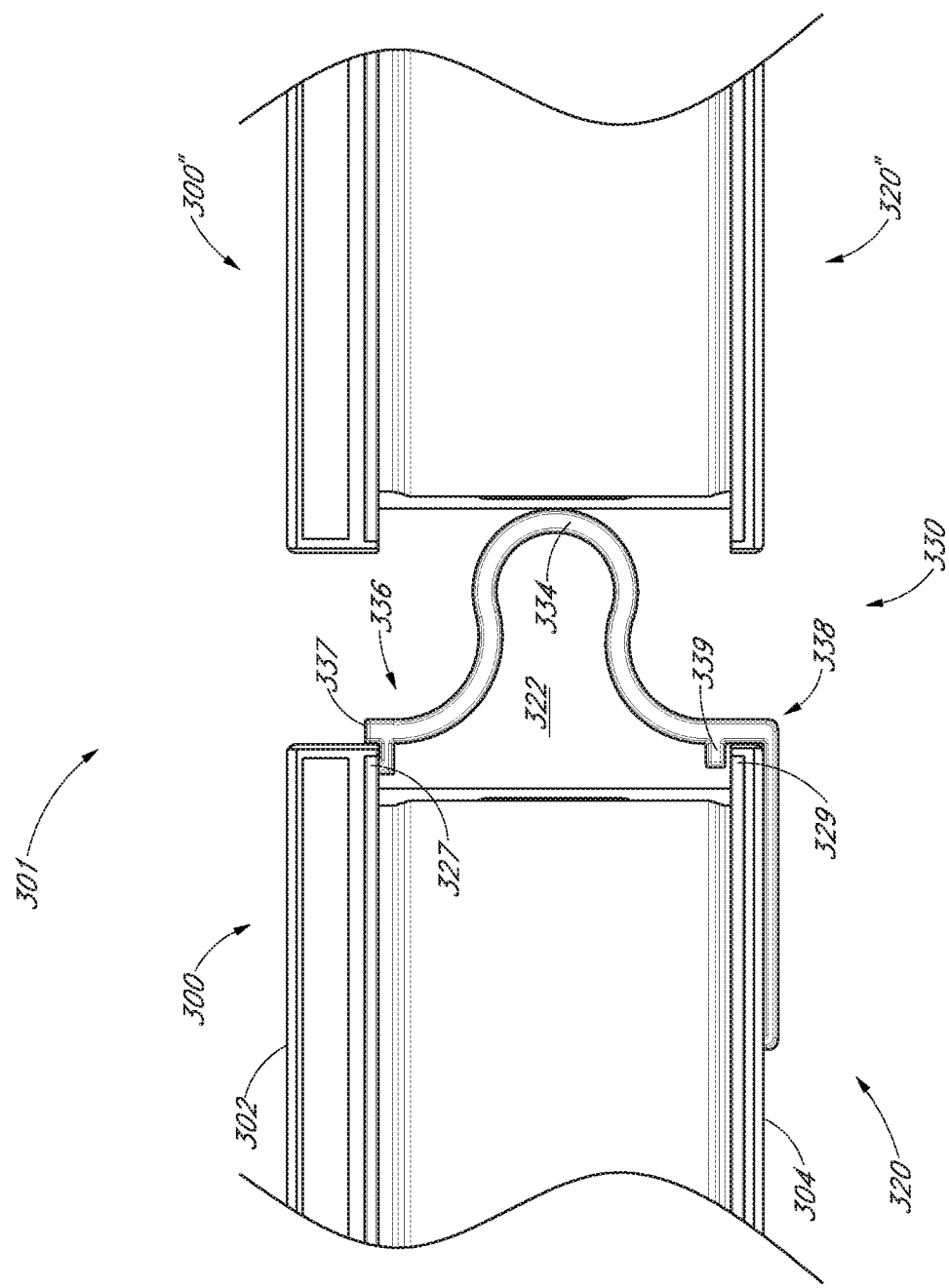
FIG. 7 depicts a side view of a PV assembly, in accordance with an embodiment of the present disclosure.

In an embodiment, spacing devices comprise one or more features to engage and/or contact the module at any desirable location. In the example depicted in FIG. 6, the engagement features 237/239 of the spacing device 230 engage outer surface features 227/229 located at side edge 222 of frame 200. In other embodiments, the spacing device can comprise one or more engagement and/or abutting features to engage or contact the module at a back side of the module. FIG. 7 depicts a side view of PV assembly 301 comprising a first module 300 of a first row, a second module 300" of a second row and spacing device 330 therebetween. The spacing device 330 comprises an upper arm 336 comprising upper engagement feature 337 for engaging upper surface feature 327 of frame 320. The spacing device 330 further comprises a lower arm 338 comprising a lower engagement feature 339 for engaging lower surface feature 329 of frame 320. The lower arm 338 of spacing device 330 extends to the back side 304 of module 200 as depicted in FIG. 7 and FIG. 8.

Figure 8:
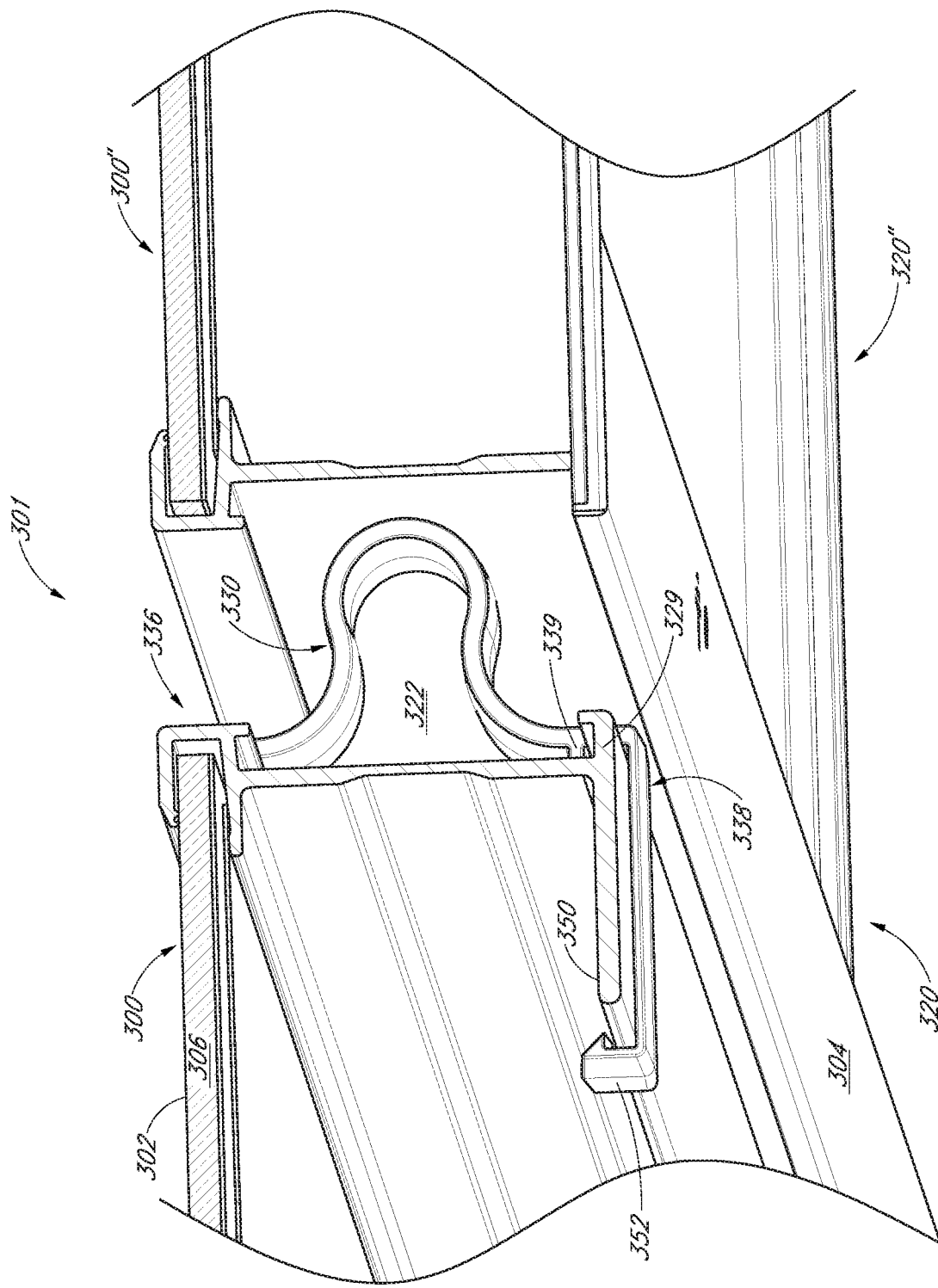
FIG. 8 depicts a perspective back side view of a PV assembly, in accordance with an embodiment of the present disclosure.

FIG. 8 depicts a perspective back side view of PV assembly 301. The cross sectional view of module 300 in FIG. 8 shows frame 320 surrounding laminate 306. The lower arm 338 of spacing device 330 comprises an engagement feature 352 for engaging an outer surface feature 350 located underneath or at the back side 304 of module 300. In an embodiment, the arms 336/338 can comprise any desirable number or type of engagement features and/or abutting features to set or establish a predetermined distance or gap between adjacent modules of a PV array including but not limited to a hooking feature, an L-shaped feature, a recessed feature, a projecting feature, a substantially planar feature or a combination thereof.

Figure 9:
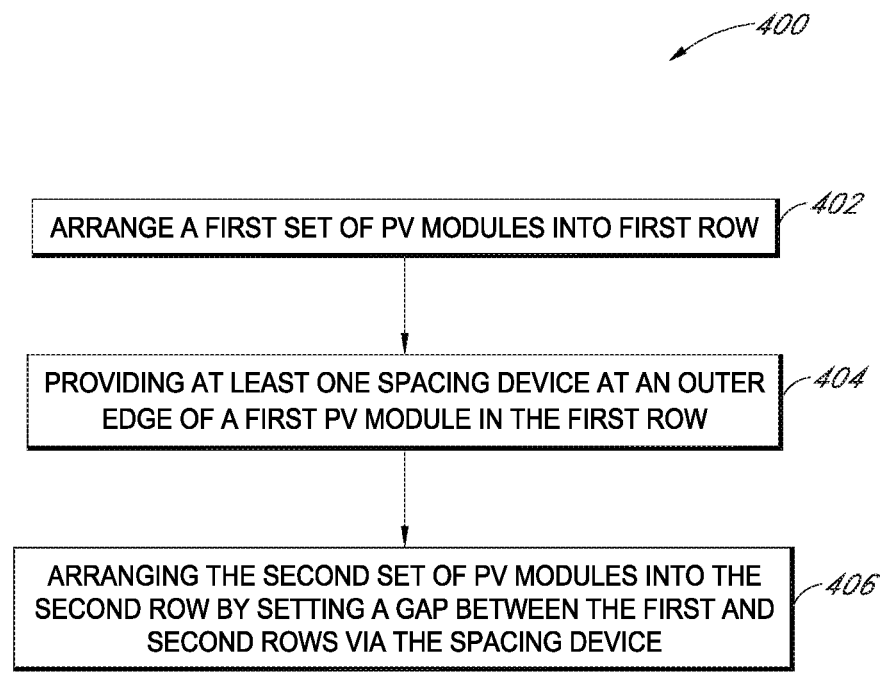
FIG. 9 depicts a flowchart listing operations in a method for assembling a PV array, in accordance with an embodiment of the present disclosure.

Improved methods for installing a plurality of PV modules to form PV arrays are also described herein. FIG. 9 depicts a flowchart 400 listing operations in a method for assembling a PV array comprising a plurality of PV modules, in accordance with an embodiment of the present disclosure. Referring to operation 402 of flowchart 400, a method for assembling a PV array comprises arranging a first set of PV modules into a first row of an array. The method further comprises providing at least one spacing device at an outer edge of a first of the PV modules in the first row at operation 404. In various embodiments wherein the spacing device comprises one or more engagement features, operation 404 can include engaging the spacing device with the PV module. Referring to operation 406 of flowchart 400, a method for assembling a PV array comprises arranging a second set of PV modules into a second row adjacent to the first row. In an embodiment, arranging the second set of PV modules into the second row comprises contacting a second of the PV modules in the second set with an abutting portion of the spacing device such that a width of the spacing device sets a predetermined distance or gap between PV modules of the first and second rows.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means-plus- or step-plus-function limitations, unless such a limitation is explicitly recited in a given claim using the phrase(s) "means for" or "step for," respectively.

What is claimed is:

1. A photovoltaic (PV) assembly comprising:
   a first row of a PV array;
   a second row of the PV array adjacent to the first row, wherein the first and second rows each comprise:
   a plurality of PV modules on a mounting structure, each PV module having a front side that faces the sun to collect solar radiation during normal operation and a back side opposite the front side, each PV module comprising:
   a laminate encapsulating a plurality of solar cells,
   a frame surrounding the laminate to define an outer edge of the PV module, the frame comprising:
   an upper portion comprising a laminate-receiving channel and an upper surface feature at the outer edge of the PV module, and
   a lower base portion comprising a lower surface feature at the outer edge of the PV module;
   a plurality of spacing devices positioned above the mounting structure between the first and second row, each spacing device comprising:
   a spacer body having a bowed structure defining a width between a first end of the bowed structure and a second end of the bowed structure opposite the first end, wherein the bowed structure of the spacer body of the spacing device forms a cavity between the first end and the second end, and wherein the spacing device comprises only a single crosspiece, wherein the crosspiece is a centrally curved outermost crosspiece with a curvature that is outward relative to the cavity,
   a non-pivoting upper engagement feature on an outwardly curved portion of the first end of the bowed structure for non-pivotably engaging the upper surface feature of a first PV module of the plurality of PV modules in the first row of the PV array,
   a non-pivoting lower engagement feature on an outwardly curved portion of the second end of the bowed structure for non-pivotably engaging the lower surface feature of the first PV module in the first row of the PV array, wherein the spacing device is symmetrical about an axis extending through a center of the bowed structure, through a center of the cavity, through a center of the single crosspiece and through a mid-point between the non-pivoting upper engagement feature on the outwardly curved portion of the first end of the bowed structure and the non-pivoting upper engagement feature on the outwardly curved portion of the second end of the bowed structure, and wherein a width of the spacing device from an end of the non-pivoting lower engagement feature to an end of the non-pivoting upper engagement feature is greater than the width between the first end of the bowed structure and the second end of the bowed structure along a direction from the end of the non-pivoting lower engagement feature to the end of the non-pivoting upper engagement feature, and
   an abutting portion on the bowed structure contacting the outer edge of a second PV module of the plurality of PV modules in the second row of the PV array,
   wherein the width defined by the bowed structure of the spacing device sets a lateral gap between the first and second rows of the PV array.

2. The PV assembly according to claim 1, wherein the non-pivoting upper and lower surface features of the frame comprise longitudinally extending ridges, and wherein the non-pivoting upper and lower engagement features of the spacing device comprise a recess sized to fit the longitudinally extending ridges of the frame, thereby fixedly connecting the spacing device to the frame.

3. A photovoltaic (PV) assembly comprising:
   a first and second PV module on a mounting structure, each comprising:
   a laminate comprising a plurality of solar cells,
   a frame at least partially surrounding the laminate, the frame comprising an outer surface feature;
   at least one spacing device positioned above the mounting structure between the first and second PV modules, the at least one spacing device comprising:
   a spacer body having a bowed structure defining a width between a first end of the bowed structure and a second end of the bowed structure opposite the first end, wherein the bowed structure of the spacer body of the spacing device forms a cavity between the first end and the second end, and wherein the spacing device comprises only a single crosspiece, wherein the crosspiece is a centrally curved outermost crosspiece with a curvature that is outward relative to the cavity, wherein the spacing device is symmetrical about an axis extending through a center of the bowed structure, through a center of the cavity, through a center of the single crosspiece and through a mid-point between the first end and the second end;
   a non-pivoting upper engagement feature and a non-pivoting lower engagement feature each on a corresponding outwardly curved portion of the bowed structure for non-pivotably engaging the outer surface feature of the frame of the first PV module, wherein a width of the spacing device from an end of the non-pivoting lower engagement feature to an end of the non-pivoting upper engagement feature is greater than the width between the first end of the bowed structure and the second end of the bowed structure along a direction from the end of the non-pivoting lower engagement feature to the end of the non-pivoting upper engagement feature; and
   an abutting portion on the bowed structure for contacting an outer edge of the frame of the second PV module;
   wherein the width defined by the bowed structure of the at least one spacing device sets a lateral gap between the first and second PV modules.

4. The PV assembly according to claim 3, wherein the first module is positioned in a first row of a PV array, the second module is positioned in a second row of the PV array, and the first row of the PV array is adjacent to the second row of the PV array.

5. The PV assembly according to claim 3, wherein the outer surface feature of the frame comprises at least one longitudinally extending ridge.

6. The PV assembly according to claim 5, wherein the non-pivoting upper engagement feature or the non-pivoting lower engagement feature of the at least one spacing device comprises at least one recess sized to fit the least one longitudinally extending ridge of the frame.

7. The PV assembly according to claim 3, wherein the at least one spacing device comprises a thermoplastic material.

8. The PV assembly according to claim 3, wherein the non-pivoting upper engagement feature or the non-pivoting lower engagement feature of the at least one spacing device engages the outer surface feature which is located at a side edge of the frame.

9. The PV assembly according to claim 3, wherein the non-pivoting upper engagement feature or the non-pivoting lower engagement feature of the at least one spacing device engages the outer surface feature which is located underneath the first PV module.

10. A spacing device for setting a lateral gap between adjacent rows of a PV array on a mounting structure, the spacing device comprising:
a spacer body having a bowed structure defining a width between a first end of the bowed structure and a second end of the bowed structure opposite the first end,
wherein the bowed structure of the spacer body of the spacing device forms a cavity between the first end and the second end, and wherein the spacing device comprises only a single crosspiece, wherein the crosspiece is a centrally curved crosspiece with a curvature that is outward relative to the cavity, wherein the spacing device is symmetrical about an axis extending through a center of the bowed structure, through a center of the cavity, through a center of the single crosspiece and through a mid-point between the first end and the second end;
a non-pivoting upper engagement feature and a non-pivoting lower engagement feature each on a corresponding outwardly curved portion of the bowed structure for non-pivotably engaging an outer surface of a first PV module in a first row of the PV array, wherein a width of the spacing device from an end of the non-pivoting lower engagement feature to an end of the non-pivoting upper engagement feature is greater than the width between the first end of the bowed structure and the second end of the bowed structure along a direction from the end of the non-pivoting lower engagement feature to the end of the non-pivoting upper engagement feature; and
at least one abutting portion on the bowed structure for contacting an outer edge of a second PV module in a second row of the PV array, the second row being adjacent to the first row;
wherein the width defined by the bowed structure of the spacer body is positioned above the mounting structure and defines the lateral gap between the first and second rows of the PV array.

11. The PV assembly according to claim 10, wherein the spacer body comprises a thermoplastic material.

12. A photovoltaic (PV) assembly comprising:
a first row of a PV array;
a second row of a PV array adjacent to the first row, wherein the first and second rows each comprise:
a plurality of PV modules on a mounting structure, each PV module having a front side that faces the sun to collect solar radiation during normal operation and a back side opposite the front side, each PV module comprising:
a laminate encapsulating a plurality of solar cells,
a frame surrounding the laminate to define an outer edge of the PV module, the frame comprising:
an upper portion comprising a laminate-receiving channel and an upper surface feature at the outer edge of the PV module, and
a lower base portion comprising a lower surface feature at the outer edge of the PV module;
a plurality of spacing devices positioned above the mounting structure between the first and second row, each spacing device comprising:
a spacer body having a bowed structure defining a width between a first end of the bowed structure and a second end of the bowed structure opposite the first end, wherein the bowed structure of the spacer body of the spacing device forms a cavity between the first end and the second end, and wherein the spacing device comprises only a single crosspiece, wherein the crosspiece is a centrally curved outermost crosspiece with a curvature that is outward relative to the cavity,
a non-pivoting upper engagement feature on an outwardly curved portion of the first end of the bowed structure for non-pivotably engaging the upper surface feature of one of the plurality of PV modules in the first row of the PV array,
a non-pivoting lower engagement feature on an outwardly curved portion of the second end of the bowed structure for non-pivotably engaging the lower surface feature of the first PV module in the first row of the PV array, wherein the spacing device is symmetrical about an axis extending through a center of the bowed structure, through a center of the cavity, through a center of the single crosspiece and through a mid-point between the non-pivoting upper engagement feature on the outwardly curved portion of the first end of the bowed structure and the non-pivoting upper engagement feature on the outwardly curved portion of the second end of the bowed structure, and wherein a width of the spacing device from an end of the non-pivoting lower engagement feature to an end of the non-pivoting upper engagement feature is greater than the width between the first end of the bowed structure and the second end of the bowed structure along a direction from the end of the non-pivoting lower engagement feature to the end of the non-pivoting upper engagement feature, and
an abutting portion on the bowed structure for contacting the outer edge of one of the plurality of PV modules in the second row of the PV array, wherein the abutting portion comprises a curved feature located vertically between the lower engagement feature and the upper engagement feature;
wherein the width defined by the bowed structure of the spacing device sets a lateral gap between the first and second rows of the PV array.

\* \* \* \* \*